United States Patent
Fattinger et al.

(10) Patent No.: US 9,735,755 B2
(45) Date of Patent: Aug. 15, 2017

(54) BAW RESONATOR HAVING LATERAL ENERGY CONFINEMENT AND METHODS OF FABRICATION THEREOF

(71) Applicant: RF Micro Devices, Inc., Greensboro, NC (US)

(72) Inventors: Gernot Fattinger, Sorrento, FL (US); Alireza Tajic, Winter Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 29 days.

(21) Appl. No.: 14/876,426

(22) Filed: Oct. 6, 2015

(65) Prior Publication Data
US 2017/0054429 A1    Feb. 23, 2017

Related U.S. Application Data

(60) Provisional application No. 62/207,702, filed on Aug. 20, 2015.

(51) Int. Cl.
*H03H 9/02* (2006.01)
*H03H 9/13* (2006.01)
(Continued)

(52) U.S. Cl.
CPC .......... *H03H 9/02157* (2013.01); *H03H 3/02* (2013.01); *H03H 9/02086* (2013.01);
(Continued)

(58) Field of Classification Search
CPC .......... H03H 9/02118; H03H 9/02102; H03H 9/132; H03H 9/02157; H03H 9/171; H03H 9/02086; H03H 3/02
(Continued)

(56) References Cited

U.S. PATENT DOCUMENTS

| | | | |
|---|---|---|---|
| 7,612,488 B1* | 11/2009 | Bouche | H03H 9/131 310/320 |
| 2002/0014808 A1* | 2/2002 | Misu | H03H 9/02133 310/312 |

(Continued)

OTHER PUBLICATIONS

Pensala, Tuomas, "Thin Film Bulk Acoustic Wave Devices—Performance Optimization and Modeling," Dissertation, VTT Publications 756, 2011, pp. 50-53.

*Primary Examiner* — Robert Pascal
*Assistant Examiner* — Jorge Salazar, Jr.
(74) *Attorney, Agent, or Firm* — Withrow & Terranova, P.L.L.C.

(57) ABSTRACT

Embodiments of a Bulk Acoustic Wave (BAW) resonator in which an outer region of the BAW resonator is engineered in such a manner that lateral leakage of mechanical energy from an active region of the BAW resonator is reduced, and methods of fabrication thereof, are disclosed. In some embodiments, a BAW resonator includes a piezoelectric layer, a first electrode on a first surface of the piezoelectric layer, a second electrode on a second surface of the piezoelectric layer opposite the first electrode, and a passivation layer on a surface of the second electrode opposite the piezoelectric layer, the passivation layer having a thickness ($T_{PA}$). The BAW resonator also includes a material on the second surface of the piezoelectric layer adjacent to the second electrode in an outer region of the BAW resonator. The additional material has a thickness that is n times the thickness ($T_{PA}$) of the passivation layer.

18 Claims, 9 Drawing Sheets

(51) Int. Cl.
*H03H 3/02* (2006.01)
*H03H 9/17* (2006.01)

(52) U.S. Cl.
CPC ........ *H03H 9/02118* (2013.01); *H03H 9/132* (2013.01); *H03H 9/171* (2013.01)

(58) Field of Classification Search
USPC ........................................ 333/133, 187, 188
See application file for complete search history.

(56) References Cited

U.S. PATENT DOCUMENTS

2013/0127300 A1\* 5/2013 Umeda .................. H01L 41/18
310/365
2015/0094000 A1\* 4/2015 Aigner ..................... H03H 3/02
455/73

\* cited by examiner

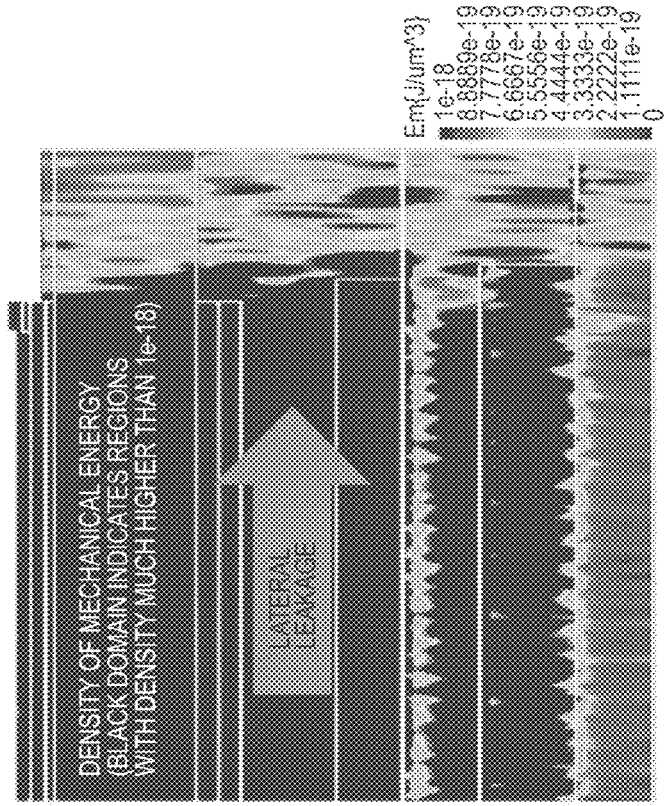
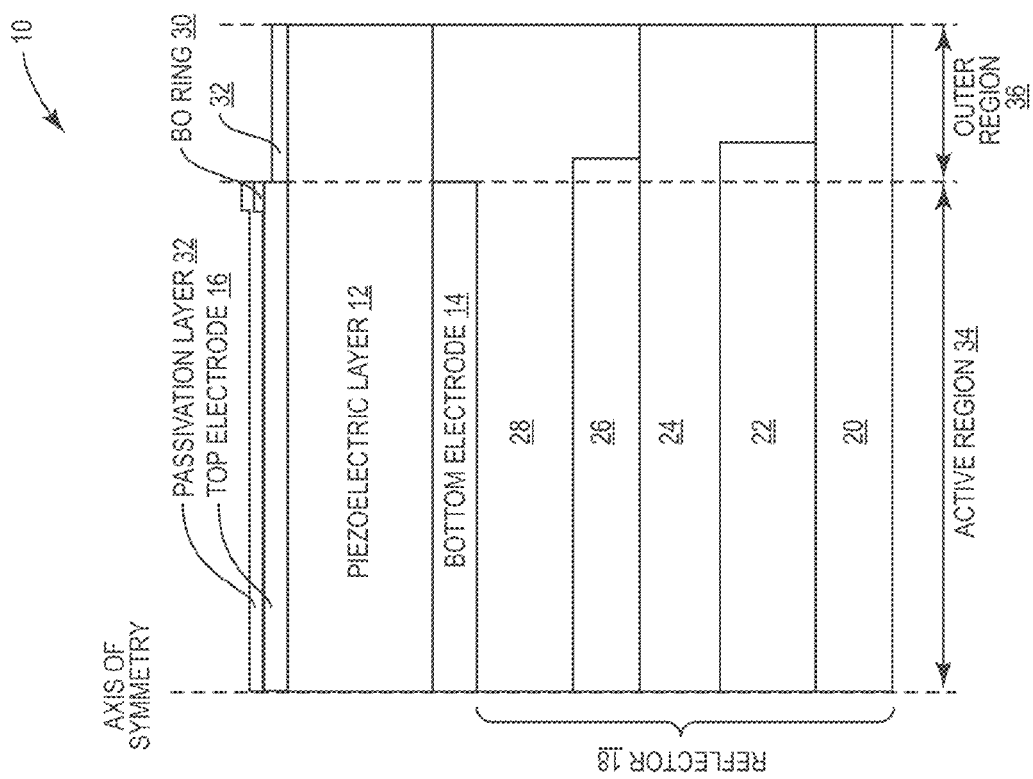
FIG. 1B (PRIOR ART)
FIG. 1A (PRIOR ART)

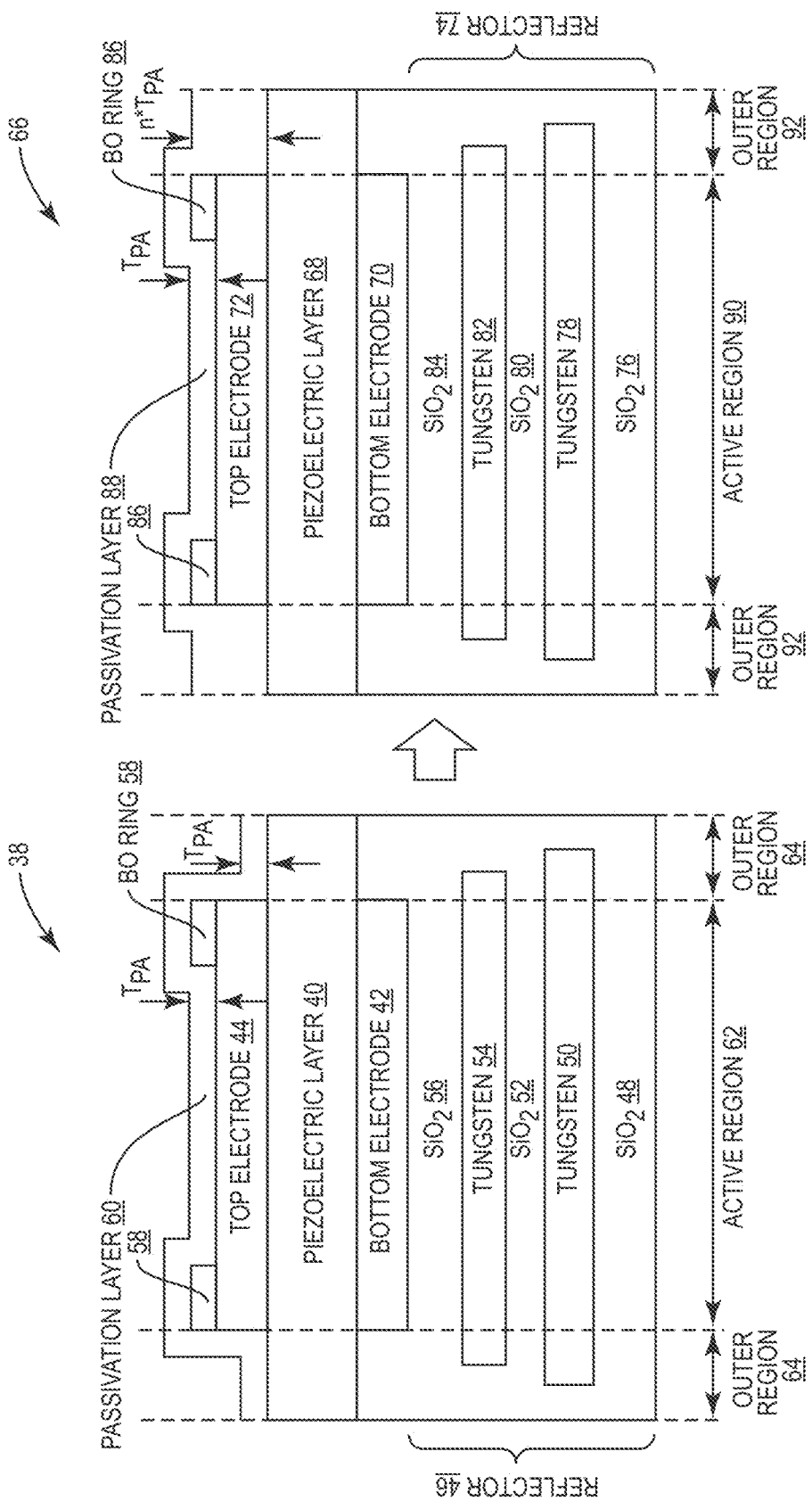

BAW RESONATOR HAVING LATERAL ENERGY CONFINEMENT AND METHODS OF FABRICATION THEREOF

RELATED APPLICATIONS

This application claims the benefit of provisional patent application Ser. No. 62/207,702, filed Aug. 20, 2015, the disclosure of which is hereby incorporated herein by reference in its entirety.

FIELD OF THE DISCLOSURE

The present disclosure relates to Bulk Acoustic Wave (BAW) resonators and, in particular, to improvement of confinement of mechanical energy within a BAW resonator.

BACKGROUND

Due to, among other things, their small size, high Q values, and very low insertion losses at microwave frequencies, particularly those above 1.5 Gigahertz (GHz), Bulk Acoustic Wave (BAW) filters have become the filter of choice for many modern wireless applications. In particular, BAW filters are the filter of choice for many $3^{rd}$ Generation (3G) and $4^{th}$ Generation (4G) wireless devices. For instance, virtually all Long Term Evolution (LTE) compatible mobile devices operating in LTE frequency bands above 1.9 GHz utilize BAW filters. For mobile devices, the low insertion loss of the BAW filter provides many advantages such as, e.g., improved battery life, compensation for higher losses associated with the need to support many frequency bands in a single mobile device, etc.

One example of a conventional BAW resonator 10 is illustrated in FIG. 1A. In this example, the BAW resonator 10 is, in particular, a Solidly Mounted Resonator (SMR) type BAW resonator 10. As illustrated, the BAW resonator 10 includes a piezoelectric layer 12 (which is sometimes referred to as a piezoelectric plate) between a bottom electrode 14 and a top electrode 16. Since the BAW resonator 10 is a SMR type BAW resonator 10, the BAW resonator 10 also includes a reflector 18 (which is more specifically referred to as a Bragg reflector) that includes multiple layers 20-28 of alternating materials with varying refractive index. In this example, the BAW resonator 10 also includes a Border (BO) ring 30 on the top surface of the top electrode 16 around the periphery of the top electrode 16. Finally, the BAW resonator 10 includes a passivation layer 32.

In operation, acoustic waves in the piezoelectric layer 12 within an active region 34 of the BAW resonator 10 are excited by an electrical signal applied to the bottom and top electrodes 14 and 16. The active region 34 is the region of the BAW resonator 10 that is electrically driven. In other words, the active region 34 is the region of the BAW resonator 10 consisting of, in this example, the bottom electrode 14, the top electrode 16, the portion of the piezoelectric layer 12 between the bottom and top electrodes 14 and 16, and the portion of the reflector 18 below the bottom electrode 14. Conversely, an outer region 36 of the BAW resonator 10 is a region of the BAW resonator 10 that is not electrically driven (i.e., the area outside of the active region 34). The frequency at which resonance of the acoustic waves occurs is a function of the thickness of the piezoelectric layer 12 and the mass of the bottom and top electrodes 14 and 16. At high frequencies (e.g., greater than 1.5 GHz), the thickness of the piezoelectric layer 12 is only micrometers thick and, as such, the BAW resonator 10 is fabricated using thin-film techniques.

Ideally, in order to achieve a high Q value, the mechanical energy should be contained, or trapped, within the active region 34 of the BAW resonator 10. The reflector 18 operates to prevent acoustic waves from leaking longitudinally, or vertically, from the BAW resonator 10 into the substrate (not shown, but below the reflector 18). Notably, in a Film Bulk Acoustic Resonator (FBAR) type BAW resonator, an air cavity is used instead of the reflector 18, where the air cavity likewise prevents acoustic waves from escaping into the substrate.

While the reflector 18 (or air cavity for a FBAR type BAW resonator) confines mechanical energy within the active region 34 of the BAW resonator 10 in the longitudinal, or vertical, direction, a substantial amount of mechanical energy still leaks laterally from the active region 34 of the BAW resonator 10 into the outer region 36 of the BAW resonator 10 and then down into the substrate, as illustrated FIG. 1B. This lateral leakage of mechanical energy at the boundaries of the BAW resonator 10 degrades the Q of the BAW resonator 10. As such, there is a need for systems and methods for mitigating the loss of mechanical energy through lateral dispersion into the outer region 36 of the BAW resonator 10.

SUMMARY

Embodiments of a Bulk Acoustic Wave (BAW) resonator in which an outer region of the BAW resonator is engineered in such a manner that lateral leakage of mechanical energy from an active region of the BAW resonator is reduced, and methods of fabrication thereof, are disclosed. In some embodiments, a BAW resonator includes a piezoelectric layer, a first electrode on a first surface of the piezoelectric layer, a second electrode on a second surface of the piezoelectric layer opposite the first electrode on the first surface of the piezoelectric layer, and a passivation layer on a surface of the second electrode opposite the piezoelectric layer, the passivation layer having a thickness ($T_{P4}$). The BAW resonator also includes a material on the second surface of the piezoelectric layer adjacent to the second electrode in an outer region of the BAW resonator. The outer region of the BAW resonator is a region outside of an active region of the BAW resonator. The additional material has a thickness that is n times the thickness ($T_{P4}$) of the passivation layer, wherein n is a value other than 1. In this manner, lateral leakage of the mechanical energy from the active region of the BAW resonator into the outer region of the BAW resonator can be reduced.

In some embodiments, n is within a range of values for which a density of mechanical energy in the outer region of the BAW resonator is reduced as compared to a density of mechanical energy in the outer region of the BAW resonator when n is equal to 1.

In some embodiments, n is such that the outer region of the BAW resonator and the active region of the BAW resonator are acoustically matched in such a manner that one or more wavelengths that cause energy leakage into the outer region are not excited in the active region.

In some embodiments, the BAW resonator further includes a Border (BO) ring around a periphery of the active region of the BAW resonator within or on the second electrode, the BO ring providing a mass loading.

In some embodiments, the BAW resonator further includes a BO ring around a periphery of the active region of the BAW resonator, and n is such that a thickness of the one or more material layers in the outer region of the BAW resonator is less than or equal to a combined thickness of the second electrode, the BO ring, and the passivation layer within the active region.

In some embodiments, the passivation layer is also on the surface of the piezoelectric layer adjacent to the second electrode in the outer region of the BAW resonator, and the one or more material layers in the outer region consist of the portion of the passivation layer in the outer region of the BAW resonator such that the thickness of the passivation layer in the outer region is n times the thickness ($T_{PA}$) of the passivation layer in the active region. Further, in some embodiments, the BAW resonator further includes a BO ring around a periphery of the active region of the BAW resonator, and n is such that a thickness of the passivation layer in the outer region of the BAW resonator is less than or equal to a combined thickness of the second electrode, the BO ring, and the passivation layer within the active region. Further, in some embodiments, the piezoelectric layer is Aluminum Nitride (AlN), the first and second electrodes each comprise a Tungsten layer and an Aluminum Copper layer, and the passivation layer is Silicon Nitride (SiN).

In some embodiments, the one or more material layers comprise one or more layers of a material other than a passivation material comprised in the passivation layer.

Embodiments of a method of fabricating a BAW resonator are also disclosed. In some embodiments, the method of fabrication of a BAW resonator includes providing an initial structure comprising a piezoelectric layer and a first electrode on a first surface of the piezoelectric layer, providing a second electrode on a second surface of the piezoelectric layer opposite the first electrode on the first surface of the piezoelectric layer, providing a passivation layer on a surface of the second electrode opposite the piezoelectric layer within an active region of the BAW resonator, the passivation layer having a thickness ($T_{PA}$) within the active region of the BAW resonator, and providing one or more material layers on the second surface of the piezoelectric layer adjacent to the second electrode in an outer region of the BAW resonator, the outer region of the BAW resonator being a region outside of the active region of the BAW resonator and the one or more material layers having a thickness that is n times the thickness ($T_{PA}$) of the passivation layer, wherein n is a value other than 1.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A and 1B illustrate one example of a conventional Bulk Acoustic Wave (BAW) resonator and lateral leakage of mechanical energy from an active region of the BAW resonator into an outer region of the BAW resonator;

FIGS. 2A and 2B illustrate a BAW resonator having reduced lateral leakage, as compared to a reference BAW resonator, according to some embodiments of the present disclosure;

DETAILED DESCRIPTION

Figure 3B:
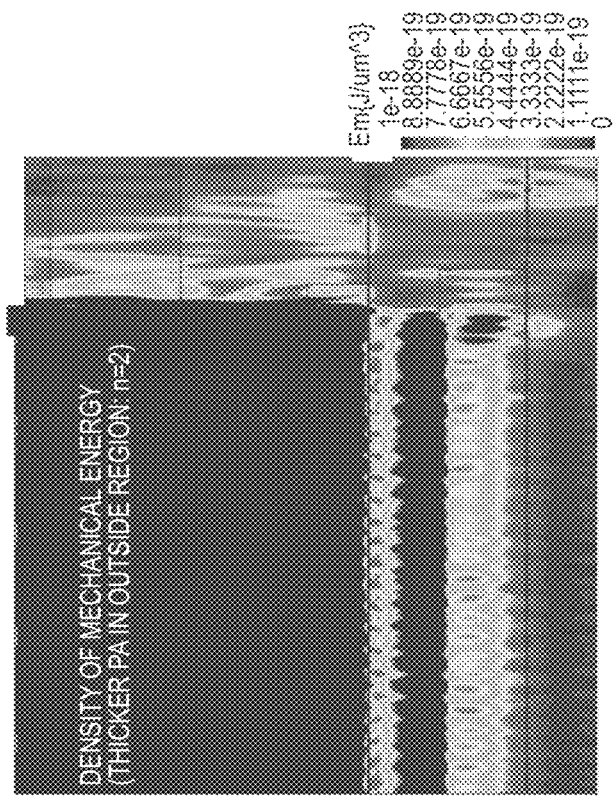
FIGS. 3A and 3B illustrate the reduced lateral leakage of the BAW resonator of FIG. 2B as compared to the reference BAW resonator of FIG. 2A, for one example implementation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms.

These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments of a Bulk Acoustic Wave (BAW) resonator in which an outer region of the BAW resonator is engineered in such a manner that lateral leakage of mechanical energy from an active region of the BAW resonator is reduced, and methods of fabrication thereof, are disclosed. In general, in some embodiments, a thickness of a material in the outer region of the BAW resonator is such that the outer region of the BAW resonator is acoustically matched to the active region of the BAW resonator in such a manner that wavelengths that cause the lateral leakage of mechanical energy are not excited in the active region. As a result, there is no leakage of wavelengths excited in the active region into oscillation modes in the outer region. In other words, the thickness of the material in the outer region of the BAW resonator is selected such that the extinction coefficient (i.e., the rate of exponential decay for evanescent waves) associated with the exponential decay in the outer region and the imaginary part of the lateral dispersion in the outer region are changed in such a manner that lateral leakage is reduced.

In this regard, FIGS. 2A and 2B illustrate a BAW resonator having reduced lateral leakage, as compared to a reference BAW resonator, according to some embodiments of the present disclosure. More specifically, FIG. 2A illustrates a reference BAW resonator 38. In this example, the reference BAW resonator 38 includes a piezoelectric layer 40 (which is sometimes referred to as a piezoelectric plate). The piezoelectric layer 40 may be any suitable type of piezoelectric material such as, for example, Aluminum Nitride (AlN) or Zinc Oxide (ZnO). Further, the piezoelectric layer 40 may be a single layer of piezoelectric material or may include multiple sublayers of the same or different piezoelectric materials.

The reference BAW resonator 38 further includes a bottom electrode 42 on a bottom surface of the piezoelectric layer 40 and a top electrode 44 on a top surface of the piezoelectric layer 40 opposite the bottom electrode 42. Each of the bottom and top electrodes 42 and 44 may be a single layer of one material or may include two or more layers of the same or different materials. For example, in some embodiments, each of the bottom and top electrodes 42 and 44 includes a layer of Tungsten immediately adjacent to the piezoelectric layer 40 and a layer of Aluminum Copper on the Tungsten layer opposite the piezoelectric layer 40.

In this example, the reference BAW resonator 38 is a Solidly Mounted Resonator (SMR) type BAW resonator and, as such, the reference BAW resonator 38 also includes a reflector 46 (which is more specifically referred to as a Bragg reflector) that includes multiple alternating layers 48, 50, 52, 54, and 56 of alternating materials with varying refractive index. In this example, the layers 48, 50, 52, 54, and 56 are alternating layers of Silicon Dioxide ($SiO_2$) and Tungsten.

In this example, the reference BAW resonator 38 also includes a Border (BO) ring 58. In this example, the BO ring 58 is a "ring" or "frame" of material that is on the top surface of the top electrode 44 around the periphery of the top electrode 44. However, the BO ring 58 may alternative be within the top electrode 44 (i.e., beneath a first metal layer of multiple metal layers forming the top electrode 44 or between two adjacent metal layers in a stack of metal layers forming the top electrode). As will be appreciated by one of ordinary skill in the art, the BO ring 58 provides mass loading or thickened edge loading, where this mass loading avoids acoustic mismatch between an active region and an outer region, providing a smooth transition of propagating waves in the active region to evanescent waves in the outer region.

Lastly, the reference BAW resonator 38 includes a passivation layer 60 on the surface of the reference BAW resonator 38 over both an active region 62 and an outer region 64 of the reference BAW resonator 38. While the passivation layer 60 can be of any suitable material, in one example, the passivation layer 60 is Silicon Nitride (SiN). For the reference BAW resonator 38, a thickness ($T_{P4}$) of the passivation layer 60 is the same both in the active region 62 and in the outer region 64. Notably, as used herein, the active region 62 is the region of the reference BAW resonator 38 that is electrically driven which, in the example of FIG. 2A, is the region consisting of the bottom electrode 42, the top electrode 44, the portion of the piezoelectric layer 40 between the bottom and top electrodes 42 and 44, and the portion of the reflector 46 beneath the bottom electrode 42. The outer region 64 is the region of the reference BAW resonator 38 that is not electrically driven or, in other words, the region of the reference BAW resonator 38 that is outside of the active region 62.

Figure 3A:
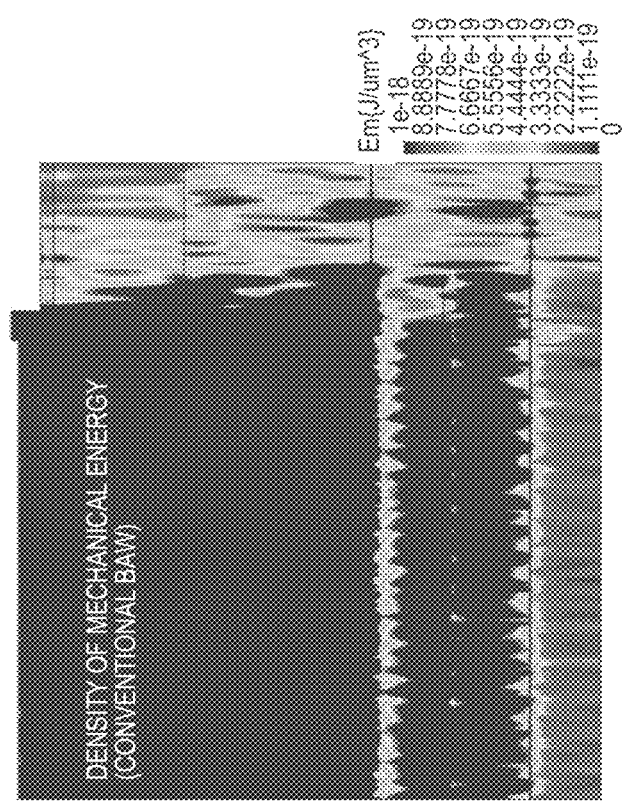

As illustrated in FIG. 3A, during operation, the reference BAW resonator 38 of FIG. 2A exhibits a significant amount of lateral leakage of mechanical energy from the active region 62 into the outer region 64. This lateral leakage, or lack of lateral confinement, degrades the quality factor (Q) of the reference BAW resonator 38.

FIG. 2B illustrates a BAW resonator 66 with improved lateral confinement (i.e., reduced lateral leakage) of mechanical energy according to some embodiments of the present disclosure. In this example, the BAW resonator 66 includes a piezoelectric layer 68 (which is sometimes referred to as a piezoelectric plate), bottom and top electrodes 70 and 72, a reflector 74 including layers 76, 78, 80, 82, and 84, and a BO ring 86, which are exactly the same as the corresponding components of the reference BAW resonator 38 and, as such, their details are not repeated.

Lastly, the BAW resonator 66 includes a passivation layer 88 on the surface of the BAW resonator 66 over both an active region 90 and an outer region 92 of the BAW resonator 66. Within the active region 90, the passivation layer 88 is exactly the same as the passivation layer 60 of the reference BAW resonator 38. Within the active region 90, the passivation layer 88 has a thickness ($T_{P4}$), which is equal to that of the passivation layer 60 of the reference BAW resonator 38. However, in the outer region 92, the passivation layer 60 has a thickness of $n \times T_{P4}$, where $n \neq 1$ (i.e., the thicknesses of the passivation layers 60 and 88 in the outer regions 64 and 92 of the reference BAW resonator 38 and the BAW resonator 66, respectively, are not the same). The value of n is in a range that reduces the lateral leakage of mechanical energy from the active region 90 of the BAW resonator 66 into the outer region 92 as compared to that of the reference BAW resonator 38 of FIG. 2A. This reduction of lateral leakage is illustrated in FIG. 3B, where FIGS. 3A and 3B are graphical illustrations of the results of a simulation of the density of mechanical energy throughout the structures of the reference BAW resonator 38 and the BAW resonator 66, respectively.

Suitable values for n may be determined, e.g., by simulation or, in some cases, empirically. However, for most practical implementations, empirical calculations are complex and, as such, simulation will provide better results.

In general, the value of n is such that the outer region 92 and the active region 90 of the BAW resonator 66 are acoustically matched such that one or more acoustic wavelengths that cause lateral leakage of mechanical energy from the active region 90 into the outer region 92 are not excited in the active region 90. As a result, the acoustic coupling between the active and outer regions 90 and 92 is mitigated and, as such, lateral leakage is reduced. In other words, n is selected such that the total thickness of the material on the surface of the piezoelectric layer 68 in the outer region 92 of the BAW resonator 66 changes the extinction coefficient associated with the exponential decay in the outer region 92 (as compared to that in the reference BAW resonator 38) and modifies the imaginary part of the lateral dispersion in the outer region 92 in such a manner that lateral leakage is reduced. In some embodiments, the value of n is selected such that the total thickness of the layers on the surface of the piezoelectric layer 68 in the outer region 92 is less than or equal to the total thickness of the top electrode 72, the BO ring 86, and the passivation layer 88 within the active region 90. This can be expressed as:

$$T_{PA\_OUT} = n \cdot T_{PA} \leq T_{ELEC} + T_{BO} + T_{PA},$$

where $T_{PA\_OUT}$ is the thickness of the passivation layer 88 in the outer region 92, $T_{ELEC}$ is the thickness of the top electrode 72, $T_{BO}$ is the thickness of the BO ring 86, and $T_{PA}$ is the thickness of the passivation layer 88 in the active region 90. In some embodiments, within the range of $0 < n \cdot T_{PA} \leq T_{ELEC} + T_{BO} + T_{PA}$, the value of n that provides the best performance (e.g., highest Q) can be determined, e.g., via simulation. Thus, the value of n can be said to be a function of the thicknesses of the material stack in the active region 90.

Figure 4:
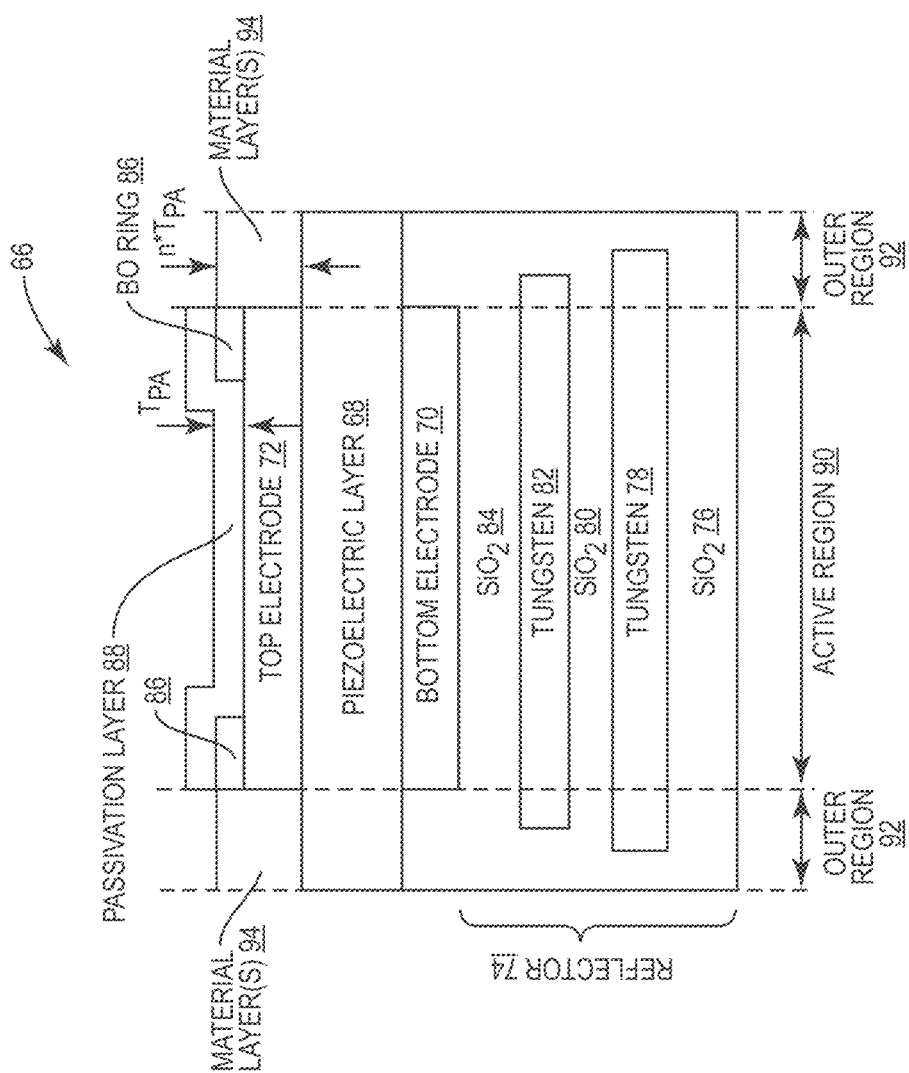
FIG. 4 illustrates a BAW resonator having reduced lateral leakage according to some other embodiments of the present disclosure.

In the embodiment of FIG. 2B, the material layers (i.e., the stack of material layers) in the outer region 92 is modified via the thickness of the passivation layer 88 in the outer region 92. However, the present disclosure is not limited thereto. Additional or alternative materials may be used in the outer region 92 to provide the desired reduction in lateral leakage. In this regard, FIG. 4 illustrates the BAW resonator 66 according to another embodiment of the present disclosure. In this example, the material layer(s) on the surface of the piezoelectric layer 68 in the outer region 92 are generalized as material layer(s) 94. The material layer(s) 94 may be the same material as the passivation layer 88 (i.e., the embodiment of FIG. 2B), some other material(s), or any combination thereof. The material layer(s) 94 has a thickness that is $n \times T_{PA}$, as described above. As also described above, the value of n is selected such that lateral leakage is reduced as compared to a corresponding reference BAW resonator (i.e., a BAW resonator that, other than the material layer(s) 94, is otherwise exactly the same as the BAW resonator 66).

In the examples of FIGS. 2B and 4, the BAW resonator 66 is a SMR type BAW resonator. However, the concepts disclosed herein are equally applicable to Film Bulk Acoustic Resonator (FBAR) type BAW resonators.

Notably, the use of the material (i.e., the passivation layer 88 having thickness $n \times T_{PA}$ in the embodiment of FIG. 2B or the material layer(s) 94 in the embodiment of FIG. 4) in the outer region 92 of the BAW resonator 66 as described herein is to be distinguished from conventional treatment of type II dispersion stacks. With respect to conventional treatment of type II resonators, mass loading of a BAW resonator is used to move the cutoff frequency of the outer region of the BAW resonator to be in the correct position, relative to the cutoff frequency of the active region, in order to trap the waves associated with the main thickness extensional wave mode. More specifically, there are two types of lateral dispersion that a thickness extensional BAW resonator can exhibit, namely, Type I and Type II. Type I, which is normally exhibited by ZnO based BAW resonators, is where the dispersion curve of the main thickness extensional wave mode is monotonically increasing from the cut-off frequency, which is defined by the frequency at which the dispersion curve crosses from real to imaginary. For Type I dispersion, mass loading of the BAW resonator in the outer region is not needed. More specifically, the top electrode not being present in the outer region is sufficient to have the outside cutoff frequency above the active cutoff frequency. This leads to an exponentially decaying main thickness wave mode in the outer region and, thus, trapping of the main thickness wave mode in the active region.

Type II lateral dispersion, which is normally exhibited by AlN based BAW resonators, is where the dispersion curve of the main thickness extensional wave mode has a negative slope. For conventional mass loading with respect to BAW resonators exhibiting Type II dispersion, the idea is to trap the small kx wave modes on the negative part of the main thickness branch. For that, the cutoff frequency of the outer region of the BAW resonator must be below the cutoff frequency of the active region to ensure that there is no propagating wave mode associated with the main thickness wave mode in the outer region. Therefore, conventional mass loading is used to move the cutoff frequency of the outer region of the BAW resonator below the cutoff frequency of the active region.

The problem with such conventional treatment of type II resonator is that it does not take into account the presence of any other higher kx branches. In practice, other higher kx branches must be taken into account to minimize lateral leakage.

In the present disclosure, depending on the particular implementation, the BAW resonator 66 may exhibit either Type I or Type II dispersion. Regardless of the dispersion type exhibited by the BAW resonator 66, unlike conventional treatment of type II resonators which moves the cutoff frequency of the outer region to a desired point relative to the cutoff frequency of the active region (i.e., higher than the cutoff frequency of the active region for Type I dispersion or lower than the cutoff frequency of the active region for Type II dispersion), the material stack in the outer region 92 of the BAW resonator 66 is engineered, as described above, in such a manner that the extinction coefficient associated with the exponential decay in the outer region 92 is changed and the imaginary part of the lateral dispersion in the outer region 92 is modified. By doing so, the way in which waves decay in the outer region 92 can be controlled to reduce lateral leakage. For example, for an embodiment of the BAW resonator 66 exhibiting Type II dispersion, the material stack in the outer region 92 is modified to improve energy trapping by modifying the imaginary part of the dispersion curve in the outer region 92. While engineering the material stack in the outer region 92 in this manner will alter the cutoff frequency of the outer region 92, the altered cutoff frequency of the outer region 92 will not necessarily be lower than the cutoff frequency of the active region 90, which is contrary to the conventional mass loading for Type II dispersion.

FIGS. 5A through 5E graphically illustrate a process for fabricating the BAW resonator of either FIG. 2B or FIG. 4 according to some embodiments of the present disclosure. As illustrated, the process begins with an initial structure that includes the piezoelectric layer 68, the bottom electrode 70, and, in this example, the reflector 74. Note, however, that the initial structure may vary depending on the particular implementation. The initial structure may be fabricated using any appropriate process.

Figure 5A:
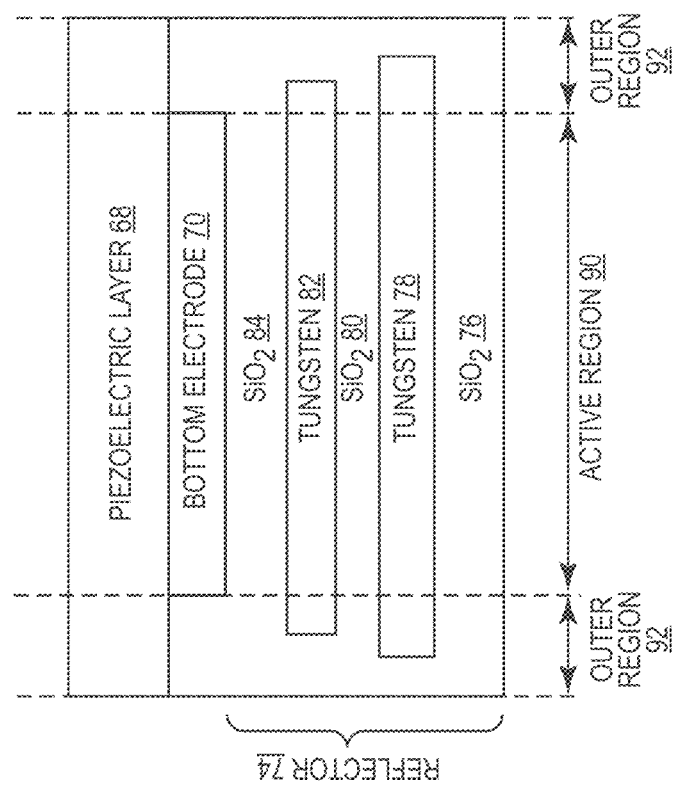
FIGS. 5A through 5E graphically illustrate a process for fabricating the BAW resonator of either FIG. 2B or FIG. 4 according to some embodiments of the present disclosure.
Figure 5B:
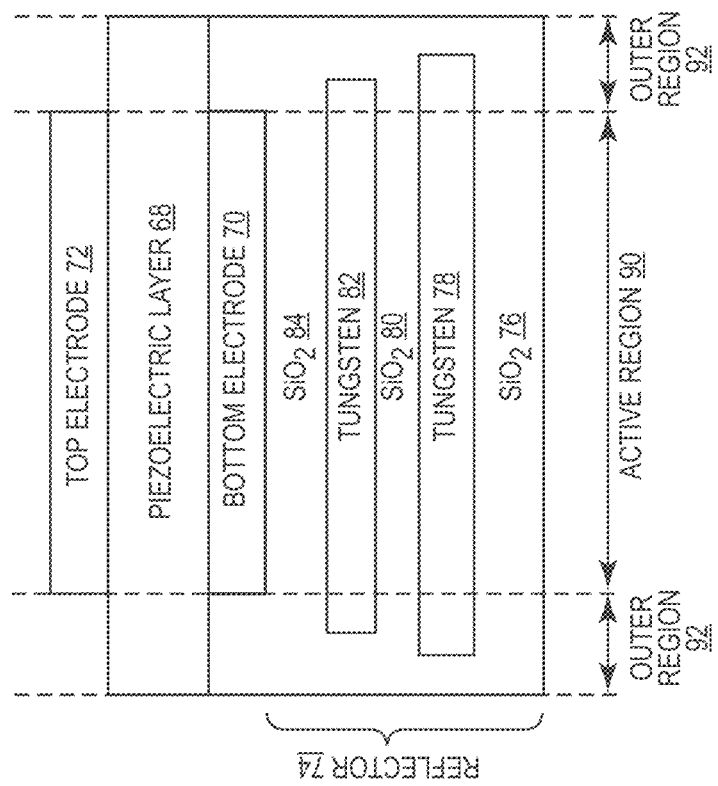
Figure 5C:
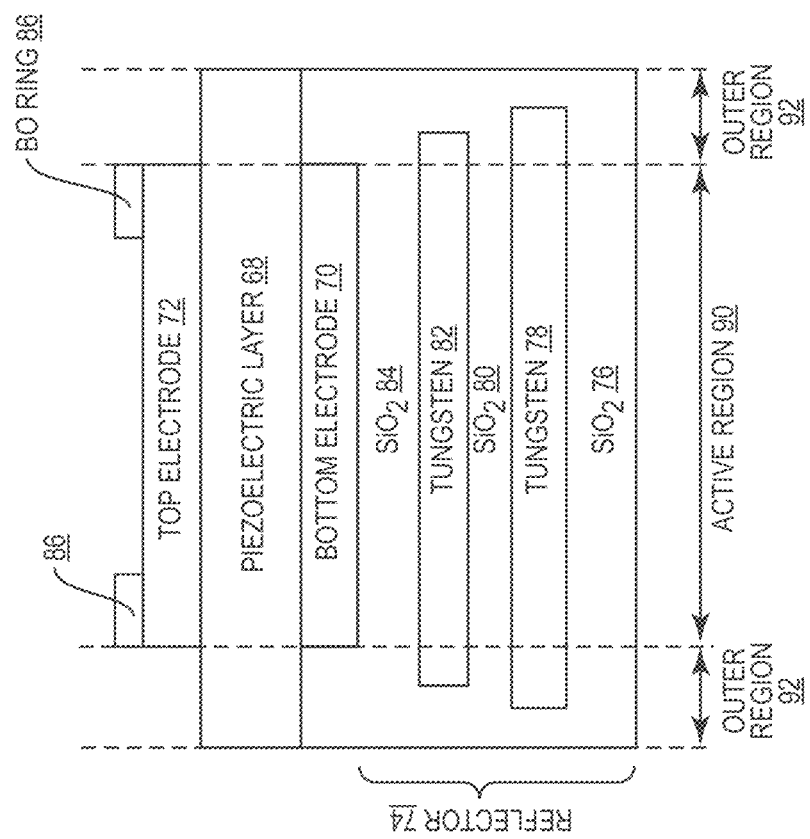
Figure 5D:
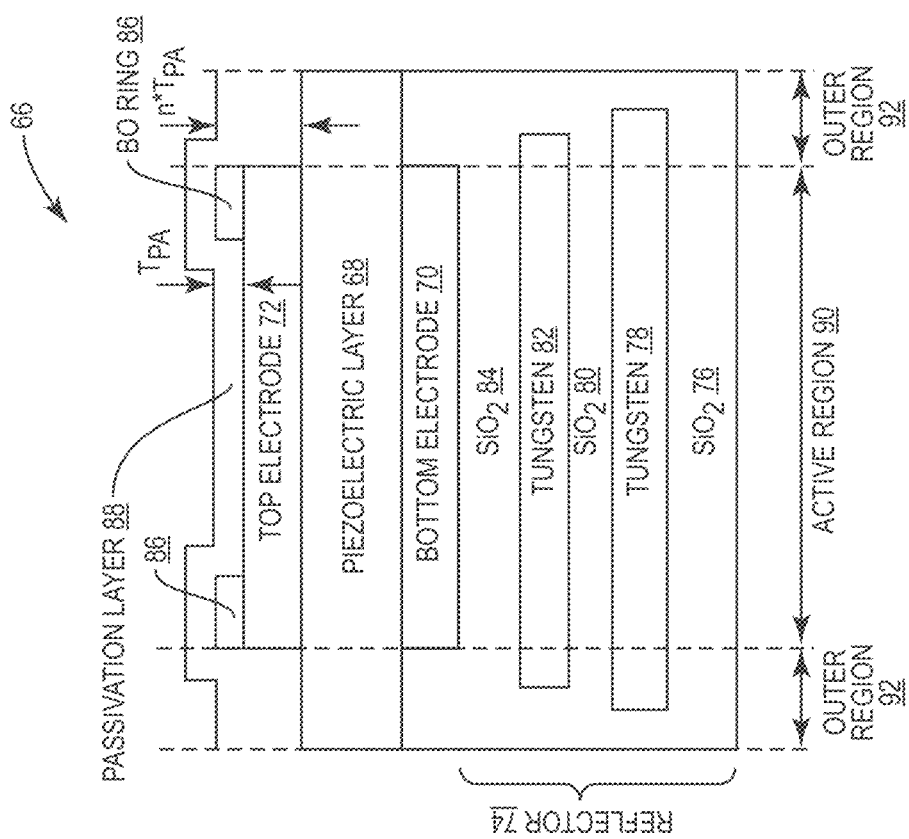
Figure 5E:
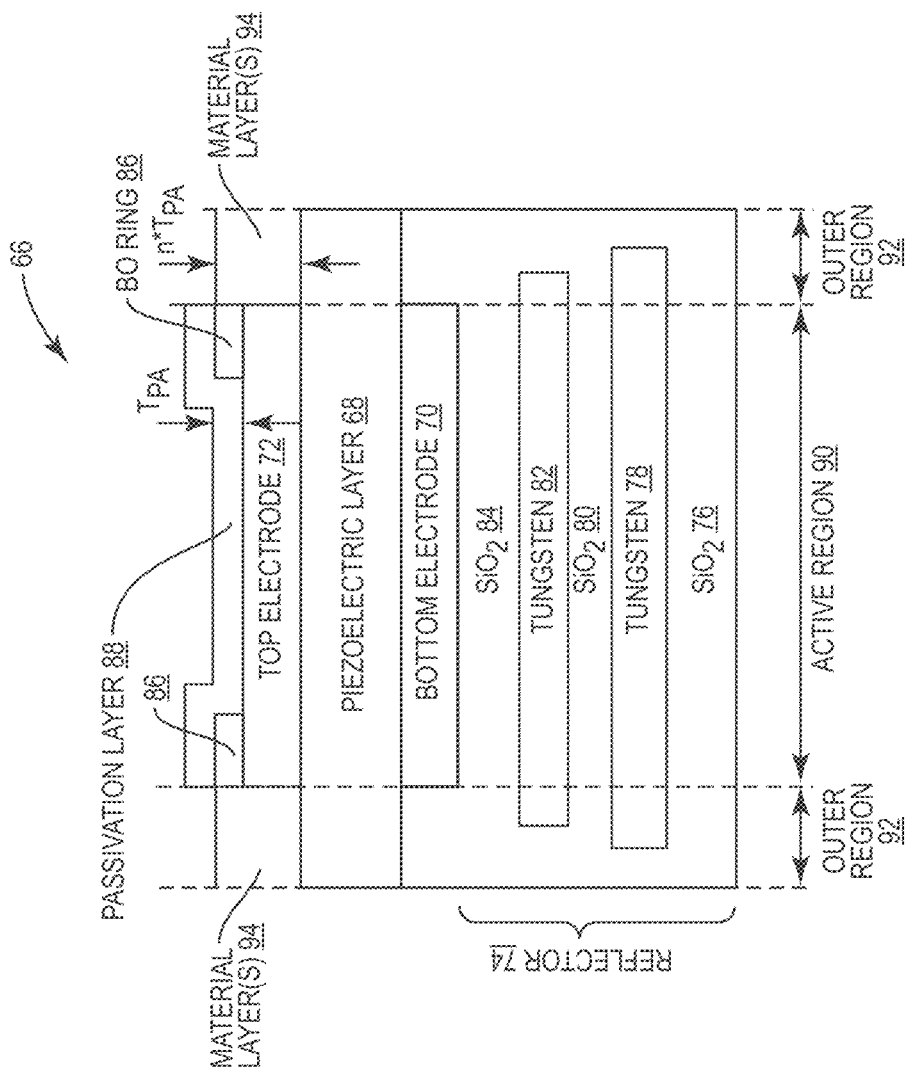

Next, as illustrated in FIG. 5B, the top electrode 72 is provided on (e.g., formed or deposited on) the surface of the piezoelectric layer 68 opposite the bottom electrode 70. Then, in this example, the BO ring 86 is provided on the surface of the top electrode 72 opposite the piezoelectric layer 68 around the periphery of the active region 90, as illustrated in FIG. 5C. Lastly, in the embodiment of FIG. 2B, the passivation layer 88 is provided (e.g., formed or deposited) on the surface of the BAW resonator 66 in both the active region 90 and the outer region 92 such that the thickness of the passivation layer 88 in the outer region 92 is n times the thickness ($T_{PA}$) of the passivation layer 88 within the active region 90, as illustrated in FIG. 5D. More generally, the passivation layer 88 is provided in the active region 90 and the one or more material layers 94 are provided in the outer region 92 according to the embodiment of FIG. 4, as illustrated in FIG. 5E.

Those skilled in the art will recognize improvements and modifications to the preferred embodiments of the present disclosure. All such improvements and modifications are considered within the scope of the concepts disclosed herein and the claims that follow.

What is claimed is:

1. A Bulk Acoustic Wave (BAW) resonator, comprising:
a piezoelectric layer;
a first electrode on a first surface of the piezoelectric layer;
a second electrode on a second surface of the piezoelectric layer opposite the first electrode on the first surface of the piezoelectric layer;
a passivation layer on a surface of the second electrode opposite the piezoelectric layer within an active region of the BAW resonator, the passivation layer having a thickness ($T_{PA}$) within the active region of the BAW resonator; and
one or more material layers on the second surface of the piezoelectric layer adjacent to the second electrode in an outer region of the BAW resonator, the outer region of the BAW resonator being a region outside of the active region of the BAW resonator and the one or more material layers having a thickness that is n times the thickness ($T_{PA}$) of the passivation layer within the active region, wherein:
n is a value other than 1; and
n is within a range of values for which a density of mechanical energy in the outer region of the BAW resonator is reduced as compared to a density of mechanical energy in the outer region of the BAW resonator when n is equal to 1.

2. The BAW resonator of claim 1 wherein the one or more material layers comprise one or more layers of a material other than a passivation material comprised in the passivation layer.

3. The BAW resonator of claim 1 wherein n is such that the outer region of the BAW resonator and the active region of the BAW resonator are acoustically matched in such a manner that one or more wavelengths that cause energy leakage into the outer region are not excited in the active region.

4. The BAW resonator of claim 1 further comprising a border ring around a periphery of the active region of the BAW resonator within or on the second electrode, the border ring providing a mass loading.

5. The BAW resonator of claim 1 further comprising a border ring around a periphery of the active region of the BAW resonator, and n is such that a thickness of the one or more material layers in the outer region of the BAW resonator is less than or equal to a combined thickness of the second electrode, the border ring, and the passivation layer within the active region.

6. The BAW resonator of claim 1 wherein the passivation layer is also on the second surface of the piezoelectric layer adjacent to the second electrode in the outer region of the BAW resonator, and the one or more material layers in the outer region is formed by a portion of the passivation layer in the outer region of the BAW resonator such that a thickness of the passivation layer in the outer region is the n times the thickness ($T_{PA}$) of the passivation layer in the active region.

7. The BAW resonator of claim 6 further comprising a border ring around a periphery of the active region of the BAW resonator, and n is such that a thickness of the passivation layer in the outer region of the BAW resonator is less than or equal to a combined thickness of the second electrode, the border ring, and the passivation layer within the active region.

8. The BAW resonator of claim 7 wherein the piezoelectric layer is Aluminum Nitride (AlN), the first and second electrodes each comprise a Tungsten layer and an Aluminum Copper layer, and the passivation layer is Silicon Nitride (SiN).

9. A BAW resonator comprising:
a piezoelectric layer;
a first electrode on a first surface of the piezoelectric layer;
a second electrode on a second surface of the piezoelectric layer opposite the first electrode on the first surface of the piezoelectric layer;
a passivation layer on a surface of the second electrode opposite the piezoelectric layer within an active region of the BAW resonator, the passivation layer having a thickness ($T_{PA}$) within the active region of the BAW resonator; and
one or more material layers on the second surface of the piezoelectric layer adjacent to the second electrode in an outer region of the BAW resonator, the outer region of the BAW resonator being a region outside of the active region of the BAW resonator and the one or more material layers having a thickness that is n times the thickness ($T_{PA}$) of the passivation layer within the active region, wherein:
n is a value other than 1; and
n is such that the outer region of the BAW resonator and the active region of the BAW resonator are acoustically matched in such a manner that one or more wavelengths that cause energy leakage into the outer region are not excited in the active region.

10. A method of fabricating a BAW resonator, comprising:
providing an initial structure comprising a piezoelectric layer and a first electrode on a first surface of the piezoelectric layer;
providing a second electrode on a second surface of the piezoelectric layer opposite the first electrode on the first surface of the piezoelectric layer;
providing a passivation layer on a surface of the second electrode opposite the piezoelectric layer within an active region of the BAW resonator, the passivation layer having a thickness ($T_{PA}$) within the active region of the BAW resonator; and
providing one or more material layers on the second surface of the piezoelectric layer adjacent to the second electrode in an outer region of the BAW resonator, the outer region of the BAW resonator being a region outside of the active region of the BAW resonator and the one or more material layers having a thickness that is n times the thickness ($T_{PA}$) of the passivation layer within the active region, wherein:

n is a value other than 1; and n is such that the outer region of the BAW resonator and the active region of the BAW resonator are acoustically matched in such a manner that one or more wavelengths that cause energy leakage into the outer region are not excited in the active region.

11. A method of fabricating a Bulk Acoustic Wave (BAW) resonator, comprising:

providing an initial structure comprising a piezoelectric layer and a first electrode on a first surface of the piezoelectric layer;

providing a second electrode on a second surface of the piezoelectric layer opposite the first electrode on the first surface of the piezoelectric layer;

providing a passivation layer on a surface of the second electrode opposite the piezoelectric layer within an active region of the BAW resonator, the passivation layer having a thickness ($T_{PA}$) within the active region of the BAW resonator; and providing one or more material layers on the second surface of the piezoelectric layer adjacent to the second electrode in an outer region of the BAW resonator, the outer region of the BAW resonator being a region outside of the active region of the BAW resonator and the one or more material layers having a thickness that is n times the thickness ($T_{PA}$) of the passivation layer within the active region, wherein:

n is a value other than 1; and n is within a range of values for which a density of mechanical energy in the outer region of the BAW resonator is reduced as compared to a density of mechanical energy in the outer region of the BAW resonator when n is equal to 1.

12. The method of claim 11 wherein n is such that the outer region of the BAW resonator and the active region of the BAW resonator are acoustically matched in such a manner that one or more wavelengths that cause energy leakage into the outer region are not excited in the active region.

13. The method of claim 11 further comprising providing a border ring around a periphery of the active region of the BAW resonator within or on the second electrode, the border ring providing a mass loading.

14. The method of claim 11 further comprising providing a border ring around a periphery of the active region of the BAW resonator, and n is such that a thickness of the one or more material layers in the outer region of the BAW resonator is less than or equal to a combined thickness of the second electrode, the border ring, and the passivation layer within the active region.

15. The method of claim 11 wherein providing the passivation layer comprises providing the passivation layer such that the passivation layer is also on the second surface of the piezoelectric layer adjacent to the second electrode in the outer region of the BAW resonator, and the one or more material layers in the outer region is formed by a portion of the passivation layer in the outer region of the BAW resonator such that the thickness of the passivation layer in the outer region is the n times the thickness ($T_{PA}$) of the passivation layer in the active region.

16. The method of claim 15 further comprising providing a border ring around a periphery of the active region of the BAW resonator, and n is such that a thickness of the passivation layer in the outer region of the BAW resonator is less than or equal to a combined thickness of the second electrode, the border ring, and the passivation layer within the active region.

17. The method of claim 16 wherein the piezoelectric layer is Aluminum Nitride (AlN), the first and second electrodes each comprise a Tungsten layer and an Aluminum Copper layer, and the passivation layer is Silicon Nitride (SiN).

18. The method of claim 11 wherein the one or more material layers comprise one or more layers of a material other than a passivation material comprised in the passivation layer.

* * * * *